(12) United States Patent
Song et al.

(10) Patent No.: US 11,289,676 B2
(45) Date of Patent: Mar. 29, 2022

(54) DISPLAY DEVICE HAVING A CLOSED CIRCULAR GROOVE PLANARIZATION LAYER

(71) Applicant: Kunshan Go-Visionox Opto-Electronics Co., Ltd., Kunshan (CN)

(72) Inventors: Yanqin Song, Kunshan (CN); Lu Zhang, Kunshan (CN)

(73) Assignee: KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 479 days.

(21) Appl. No.: 16/342,196

(22) PCT Filed: Apr. 28, 2018

(86) PCT No.: PCT/CN2018/085177
§ 371 (c)(1),
(2) Date: Apr. 15, 2019

(87) PCT Pub. No.: WO2019/100661
PCT Pub. Date: May 31, 2019

(65) Prior Publication Data
US 2021/0328178 A1    Oct. 21, 2021

(30) Foreign Application Priority Data
Nov. 24, 2017   (CN) .......................... 201721592396.9

(51) Int. Cl.
*H01L 51/52*    (2006.01)
(52) U.S. Cl.
CPC .... *H01L 51/5253* (2013.01); *H01L 2251/301* (2013.01)

(58) Field of Classification Search
CPC ........... H01L 51/5253; H01L 2251/301; G02F 2001/133357
See application file for complete search history.

(56) References Cited

U.S. PATENT DOCUMENTS 7,671,532 B2 * 3/2010 Kim ..................... H01L 51/5253
313/509
11,005,072 B2 * 5/2021 Shin ..................... H01L 27/3246
(Continued)

FOREIGN PATENT DOCUMENTS

CN          203883009 U     10/2014
CN          104584255 A      4/2015
(Continued)

OTHER PUBLICATIONS

Office Action of JP Patent Application No. 2019-567681.
European Search Report of EP18881323.2 dated Jul. 7, 2020.
International Search Report of PCT/CN2018/085177 dated Sep. 5, 2018.

*Primary Examiner* — Ida M Soward
(74) *Attorney, Agent, or Firm* — Kilpatrick Townsend & Stockton

(57) ABSTRACT

A display device with a good overall encapsulation effect, includes a light-emitting display layer, a planarization layer and an encapsulation layer which are sequentially laminated. The planarization layer is provided with at least one closed circular groove, and a projection of a closed circle formed by the groove on a plane on which the light-emitting display layer is located is completely placed outside the light-emitting display layer and surrounds the light-emitting display layer.

12 Claims, 5 Drawing Sheets

(56) References Cited

U.S. PATENT DOCUMENTS

| | | | |
|---|---|---|---|
| 11,081,527 B2* | 8/2021 | Hatano | ............ H01L 27/14636 |
| 2009/0153042 A1 | 6/2009 | Izumi et al. | |
| 2010/0320909 A1 | 12/2010 | Izumi | |
| 2015/0200370 A1 | 7/2015 | Unniknshnan et al. | |
| 2016/0028043 A1 | 1/2016 | Kwon et al. | |
| 2016/0091742 A1 | 3/2016 | Chang et al. | |
| 2016/0260928 A1 | 9/2016 | Choi et al. | |
| 2017/0117502 A1 | 4/2017 | Park | |
| 2017/0133594 A1 | 5/2017 | Mimura et al. | |
| 2017/0194601 A1 | 7/2017 | Kokame et al. | |
| 2017/0279057 A1 | 9/2017 | Park et al. | |
| 2017/0288004 A1 | 10/2017 | Kim et al. | |
| 2018/0040850 A1 | 2/2018 | Huang | |
| 2020/0020880 A1* | 1/2020 | Saida | .................... H05B 33/02 |

FOREIGN PATENT DOCUMENTS

| | | | |
|---|---|---|---|
| CN | 105445969 A | 3/2016 | |
| CN | 105449118 A | 3/2016 | |
| CN | 205452362 U | 8/2016 | |
| CN | 106876428 A | 6/2017 | |
| CN | 107221550 A | 9/2017 | |
| CN | 108281458 A | 7/2018 | |
| JP | 2009164107 A | 7/2009 | |
| JP | 2009266922 A | 11/2009 | |
| JP | 2011008969 A | 1/2011 | |
| JP | 2017091693 A | 5/2017 | |
| JP | 2017123217 A | 7/2017 | |
| JP | 2019079729 A | 5/2019 | |

* cited by examiner

DISPLAY DEVICE HAVING A CLOSED CIRCULAR GROOVE PLANARIZATION LAYER

CROSS-REFERENCE TO RELATED APPLICATIONS

This application is a U.S. national Stage of International Application No. PCT/CN2018/085177, filed on Apr. 28, 2018, designating the United States, which claims priority to Chinese Patent Application No. 201721592396.9, filed with the Chinese Patent Office on Nov. 24, 2017 and entitled "DISPLAY DEVICE", the content of each of which is hereby incorporated by reference in its entirety.

FIELD

The present disclosure relates to a photoelectric device, and more particularly, to a display device.

BACKGROUND

In existing display devices, the development prospects of flexible display devices are particularly broad and consumers have higher and higher demands on display devices. In order to ensure the flexibility of devices, a thin film encapsulation must be used rather than a conventional glass encapsulation.

The existing thin film encapsulation refers to encapsulating by using both an inorganic layer and an organic layer, so that a display device has a good blocking effect against moisture or gas.

However, in encapsulating of a display device, the material of a planarization layer is mostly an organic material. Since the water-oxygen barrier property of the organic material is poor, when the light-emitting display layer of the display device is encapsulated in the encapsulation layer, the planarization layer located underneath the light-emitting display easily affects the encapsulation effect of the entire display device, thereby affecting the service life of the display device. Therefore, it is very important to seek a display device with a good overall encapsulation effect.

SUMMARY

In view of the above, it is necessary to provide a display device with a good overall encapsulation effect to address the above-mentioned problems.

A display device is provided, including a light-emitting display layer, a planarization layer, and an encapsulation layer which are sequentially laminated. The planarization layer is provided with at least one closed circular groove, and a projection of a closed circle formed by the groove on a plane on which the light-emitting display layer is located is completely placed outside the light-emitting display layer and surrounds the light-emitting display layer.

In an embodiment, the encapsulation layer includes an inorganic layer. A projection of a boundary of the planarization layer on a plane on which the light-emitting display layer is located is placed inside a projection of a boundary of the inorganic layer on the plane on which the light-emitting display layer is located, and does not overlap with the projection of the boundary of the inorganic layer on the plane of the light-emitting display layer.

In an embodiment, a distance between a projection of the groove on the plane of the light-emitting display layer and the projection of the boundary of the inorganic layer on the plane of the light-emitting display layer is between 1 micrometer and 3,000 micrometers.

In an embodiment, the display device further includes an insulated layer, to which an edge of the inorganic layer is connected.

In an embodiment, the insulated layer isolates the planarization layer from a driving element of the display device.

In an embodiment, the encapsulation layer includes an organic layer. A projection of the organic layer on the plane on which the light-emitting display layer is located can completely cover the light-emitting display layer and is placed within the projection of the closed circle formed by the groove on the plane on which the light-emitting display layer is located.

In an embodiment, a distance between a projection of the groove on the plane on which the light-emitting display layer is located and the projection of the boundary of the organic layer on the plane on which the light-emitting display layer is located is between 1 micrometer and 1,000 micrometers.

In an embodiment, the encapsulation layer further includes a plurality of inorganic layers laminated alternately with the organic layer, and an edge of the organic layer does not exceed an edge of the inorganic layer.

In an embodiment, the groove extends through the planarization layer in a thickness direction of the planarization layer.

In an embodiment, the groove does not extend through the planarization layer completely and forms an opening on the planarization layer, the opening facing toward the encapsulation layer.

In an embodiment, the groove has a depth of 30% or more of a thickness of the planarization layer.

In an embodiment, the groove has a width between 1 micrometer and 100 micrometers.

In the display device described above, at least one closed circular groove is provided in the planarization layer to surround the light-emitting display layer, so as to avoid the planarization layer from continuously extending from the boundary of the encapsulation layer to the light-emitting display layer, thereby avoiding moisture or oxygen from entering the inside of the encapsulation layer through the planarization layer, to improve the encapsulation effect and service life of the display device.

DESCRIPTION OF THE REFERENCE NUMERALS

10-light-emitting display layer, 20-planarization layer, 30-encapsulation layer, 301-inorganic layer, 302-organic layer, 40-groove, and 50-insulated layer.

DETAILED DESCRIPTION

Figure 1:
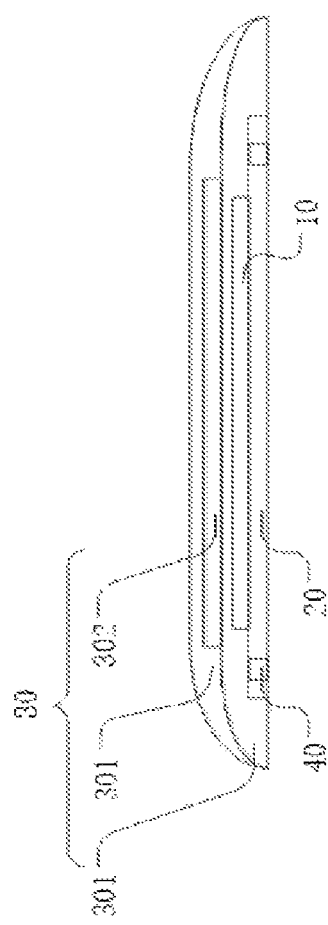
FIG. 1 is a cross-sectional view of a display device according to a first embodiment of the present disclosure.
Figure 2:
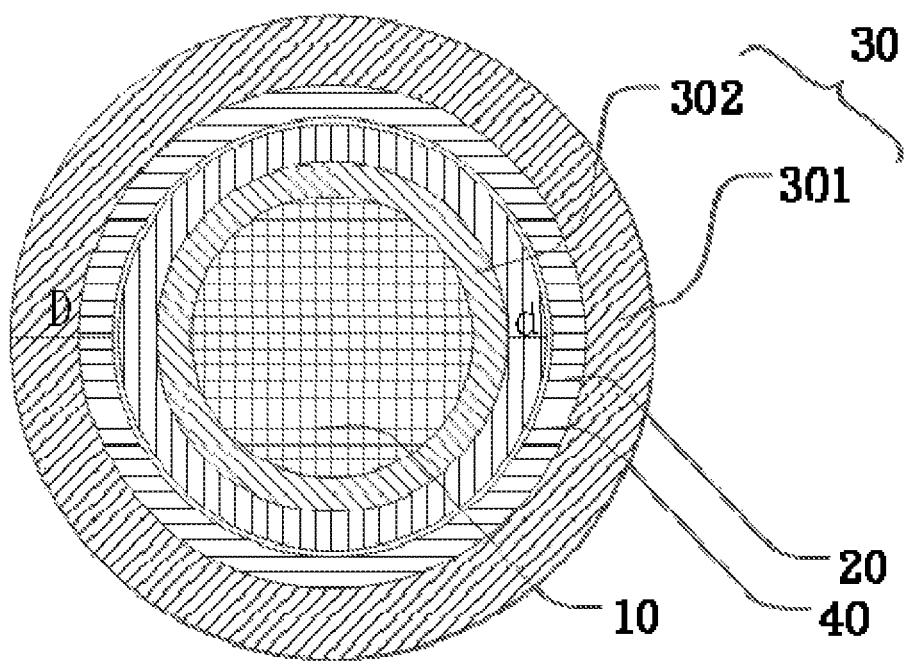
FIG. 2 is a top view of the display device according to the first embodiment of the present disclosure.

Referring to FIG. 1 and FIG. 2, a display device is provided according to an embodiment of the present disclosure, including a light-emitting display layer 10, a planarization layer 20, and an encapsulation layer 30. The planarization layer 20 is provided with at least one closed circular groove 40, and a projection of a closed circle formed by the groove 40 on a plane on which the light-emitting display layer 10 is located is completely placed outside the light-emitting display layer 10 and surrounds the light-emitting display layer 10.

In the display device described above, the closed groove 40 can effectively block the outside moisture or oxygen from seeping through a contact surface between the encapsulation layer 30 and the planarization layer 20 and making contact with the light-emitting display layer 10, thereby improving the moisture-blocking and oxygen-blocking performance of the device and effectively improving the encapsulation effect, to increase the service life of the display device. Experiments prove that the display device of the present technical solution can light up for 1,230 hours under a condition of high temperature and high humidity, which considerably exceeds 480 hours for a display device without the groove 40.

Preferably, the encapsulation layer 30 includes an inorganic layer 301. A projection of a boundary of the planarization layer 20 on the plane on which the light-emitting display layer 10 is located is placed inside a projection of a boundary of the inorganic layer 301 on the plane on which the light-emitting display layer 10 is located, and does not coincide with the projection of the boundary of the inorganic layer 301. The inorganic layer 301 has good moisture-blocking and oxygen-blocking performances for blocking the contact of the external moisture or oxygen with the light-emitting display layer 10 to protect the light-emitting display layer 10. By covering the planarization layer 20 with the inorganic layer 301 completely, moisture or oxygen is better prevented from entering the inside of the encapsulation layer 30 through the planarization layer 20. Preferably, a distance D between the projection of the groove 40 on the plane on which the light-emitting display layer 10 is located and the projection of the boundary of the inorganic layer 301 on the plane on which the light-emitting display layer 10 is located is between 1 micrometer and 3,000 micrometers. The non-display area of the display device is minimized as much as possible while ensuring that the planarization layer 20 is completely covered with the inorganic layer 301, so that the effective display area of the display device is sufficiently enlarged.

Figure 3:
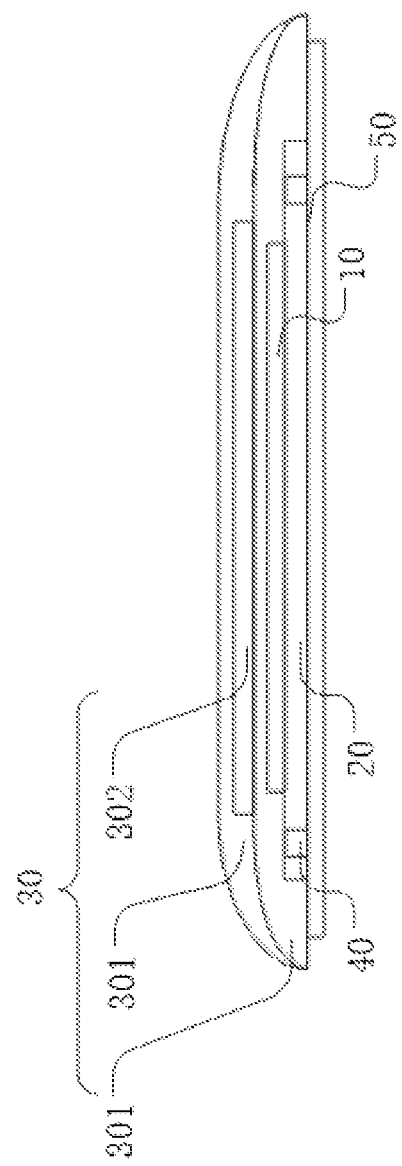
FIG. 3 is a cross-sectional view of a display device according to a second embodiment of the present disclosure.

Preferably, referring to FIG. 3, an insulated layer 50 is further included, to which an edge of the inorganic layer 301 is connected. The insulated layer 50 is used for isolating the planarization layer 20 from a driving element of the display device to achieve a protect effect on the driving element. By connecting the edge of the inorganic layer 301 to the insulated layer 50, on one hand the planarization layer 20 can be more completely encapsulated, and on the other hand the inorganic layer 301 has a better performance to be combined with the insulated layer 50, to realize a more reliable encapsulation effect more easily.

Preferably, the encapsulation layer 30 further includes an organic layer 302 laminated with the inorganic layer 301 adjacently. The organic layer 302 has good flexibility for preventing the inorganic layer 301 from cracking during bending. More preferably, a projection of the organic layer 302 on the plane on which the light-emitting display layer 10 is located can completely cover the light-emitting display layer 10 and is placed inside the projection of the closed circle formed by the groove 40 on the plane on which the light-emitting display layer 10 is located. A distance d between the projection of the groove 40 on the plane on which the light-emitting display layer 10 is located and a projection of a boundary of the organic layer 302 on the plane on which the light-emitting display layer 10 is located is between 1 micrometer and 1,000 micrometers. According to this configuration, when the organic layer is disposed inside the groove, the formation of the organic layer and the inorganic layer does not have any sags because of the presence of the groove, thereby further ensuring the uniformity of the thicknesses of the organic layer 302 and the inorganic layer 301.

Preferably, the groove 40 extends through the planarization layer 20 in a thickness direction of the planarization layer 20. This configuration of the groove 40 completely blocks the transmission path of the moisture or oxygen in the planarization layer 20.

Figure 4:
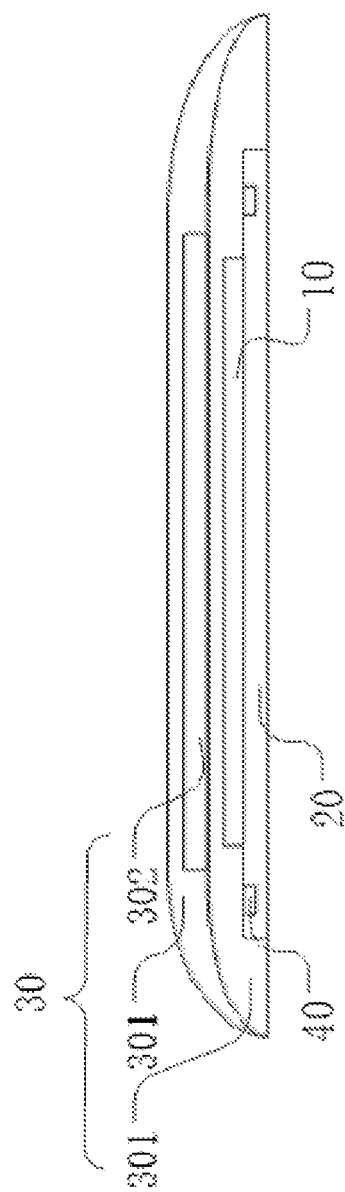
FIG. 4 is a cross-sectional view of a display device according to a third embodiment of the present disclosure.

Referring to FIG. 4, in another embodiment, the groove 40 also may not completely extend through the planarization layer 20, and form an opening on the planarization layer 20. The opening faces toward the encapsulation layer 30. In actual manufacturing, if the planarization layer 20 is processed to have a groove completely extending through the planarization layer 20, it is difficult to ensure the entirety of the film structure underneath the planarization layer 20, and the device performance may be affected consequently. In contrast, if the groove 40 is made not to completely extend through the planarization layer 20, it can avoid the damage to the film layer underneath the planarization layer 20 during the formation of the groove 40 caused by the low process precision, resulting in a lower requirement for the processing of the planarization layer 20, which is easier to realize.

Preferably, the groove 40 has a depth of 30% or more of a thickness of the planarization layer 20, and this depth of the groove 40 is most controllable during the actual process.

Preferably, the groove 40 has a width between 1 micrometer and 100 micrometers. Under the condition of a constant depth, the larger the width of the groove 40, the larger the volume of the groove 40 is, i.e. the larger the retention space in the process of diffusion and permeation of moisture or oxygen into the device, the better moisture-blocking and oxygen-blocking performances of the device are. However, the wider the width of the groove 40, the more easily sags on the encapsulation layer 30 covering the groove 40 are formed, which affects the flatness of the device. Thus this width setting of the groove not only ensures the moisture-blocking and gas-blocking performance of the device, but also does not affect the overall flatness of the display device.

In the embodiments of FIG. 1 to FIG. 3, the encapsulation layer 30 is disposed in a laminated manner with the light-emitting display layer 10 and the planarization layer 20, and the encapsulation layer 30 includes two inorganic layers 301 and one organic layer 302. The organic layer 302 is laminated between the two inorganic layers 301, and the edge of the organic layer 302 does not exceed the edges of the inorganic layers 301.

Figure 5:
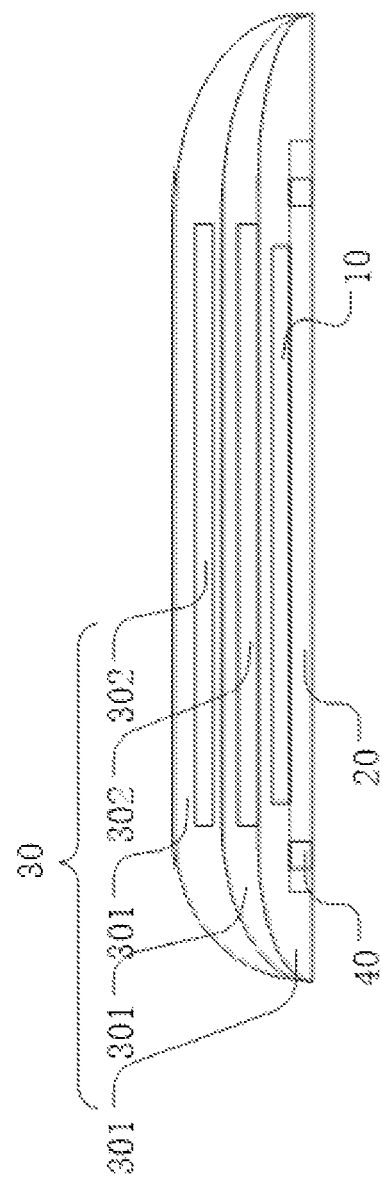
FIG. 5 is a cross-sectional view of a display device according to a fourth embodiment of the present disclosure.

Referring to FIG. 5, in another embodiment, the encapsulation layer 20 includes three inorganic layers 301 and two organic layers 302 alternately laminated to further block diffusion and penetration of moisture or a harmful gas in the encapsulation layer 20, thereby improving the moisture-blocking and gas-blocking performances of the flexible device, as well as increasing the bending life of the flexible device.

The above-mentioned embodiments are merely illustrative of several embodiments of the present disclosure, and the description thereof is more specific and detailed, but is not to be construed as limiting the scope of the present disclosure. It should be noted that a number of variations and modifications may be made by those skilled in the art without departing from the spirit and scope of the disclosure, which belong to the protection scope of the present disclosure. Therefore, the scope of the disclosure should be determined by the appended claims.

The invention claimed is:

1. A display device, comprising a light-emitting display layer, a planarization layer and an encapsulation layer which are sequentially laminated,
    wherein the planarization layer is provided with at least one closed circular groove, and a projection of a closed circle formed by the groove on a plane on which the light-emitting display layer is located is completely placed outside the light-emitting display layer and surrounds the light-emitting display layer.

2. The display device of claim 1, wherein the encapsulation layer comprises an inorganic layer, a projection of a boundary of the planarization layer on the plane on which the light-emitting display layer is located is placed inside a projection of a boundary of the inorganic layer on the plane on which the light-emitting display is located, and does not overlap with the projection of the boundary of the inorganic layer on the plane on which the light-emitting display layer is located.

3. The display device of claim 2, wherein a distance between a projection of the groove on the plane on which the light-emitting display layer is located and the projection of the boundary of the inorganic layer on the plane on which the light-emitting display layer is located is between 1 micrometer and 3,000 micrometers.

4. The display device of claim 2, further comprising an insulated layer, an edge of the inorganic layer being connected to the insulated layer.

5. The display device of claim 2, wherein the insulated layer isolates the planarization layer from a driving element of the display device.

6. The display device of claim 1, wherein the encapsulation layer comprises an organic layer, a projection of the organic layer on the plane on which the light-emitting display layer is located completely covers the light-emitting display layer and is located inside the projection of the closed circle formed by the groove on the plane on which the light-emitting display layer is located.

7. The display device of claim 6, wherein a distance between a projection of the groove on the plane on which the light-emitting display layer is located and a projection of a boundary of the organic layer on the plane on which the light-emitting display layer is located is between 1 micrometer and 1,000 micrometers.

8. The display device of claim 6, wherein the encapsulation layer further comprises a plurality of inorganic layers laminated alternately with the organic layer, an edge of the organic layer not exceeding an edge of the inorganic layer.

9. The display device of claim 1, wherein the groove extends through the planarization layer in a thickness direction of the planarization layer.

10. The display device of claim 1, wherein the groove does not extend through the planarization layer completely and forms an opening on the planarization layer, the opening facing toward the encapsulation layer.

11. The display device of claim 10, wherein the groove has a depth of 30% or more of a thickness of the planarization layer.

12. The display device of claim 1, wherein the groove has a width between 1 micrometer and 100 micrometers.

* * * * *